US012609696B2

(12) United States Patent
Farzaneh

(10) Patent No.: US 12,609,696 B2
(45) Date of Patent: Apr. 21, 2026

(54) DATA DRIVERS

(71) Applicant: Semtech Corporation, Camarillo, CA (US)

(72) Inventor: Behzad Farzaneh, London (GB)

(73) Assignee: Semtech Corporation, Camarillo, CA (US)

( * ) Notice: Subject to any disclaimer, the term of this patent is extended or adjusted under 35 U.S.C. 154(b) by 245 days.

(21) Appl. No.: 18/470,871

(22) Filed: Sep. 20, 2023

(65) Prior Publication Data

US 2025/0096795 A1 Mar. 20, 2025

(51) Int. Cl.
| | |
|---|---|
| *H03K 17/60* | (2006.01) |
| *H01S 5/026* | (2006.01) |
| *H03K 17/06* | (2006.01) |
| *H03K 19/00* | (2006.01) |
| *H04B 10/50* | (2013.01) |

(52) U.S. Cl.
CPC ........... *H03K 17/60* (2013.01); *H01S 5/0261* (2013.01); *H03K 17/06* (2013.01); *H03K 19/0005* (2013.01); *H04B 10/5053* (2013.01)

(58) Field of Classification Search
CPC .......... H01S 5/0261; H01S 5/026; H01S 5/02; H01S 5/042; H01S 5/062; H03K 17/16; H03K 17/60
USPC ........................................................ 327/108
See application file for complete search history.

(56) References Cited

U.S. PATENT DOCUMENTS 5,805,012 A * 9/1998 Jeon ................. H03K 19/00384
327/543
12,051,896 B2 * 7/2024 Peng ................ H03K 19/00315

FOREIGN PATENT DOCUMENTS

| CN | 114284860 A | 4/2022 |
|---|---|---|
| CN | 114709713 A | 7/2022 |

OTHER PUBLICATIONS

Extended European Search Report for EP Patent Application No. 24200122.0 dated Feb. 27, 2025 (8 pages).

* cited by examiner

Primary Examiner — Hai L Nguyen
(74) *Attorney, Agent, or Firm* — Alston & Bird LLP

(57) ABSTRACT

This application relates to data driver circuits, in particular to laser drivers. A driver is configured to receive an input signal and generate a corresponding driver output signal for driving an output device, such as a laser. A bias generator has a first output branch connected to an output node of the bias generator and a first control loop is configured to control a current in the first output branch to have a defined relationship to a bandgap referred current to provide a first bias current for biasing the output device. A driver output node is coupled to the driver and also to the output node of the bias generator, for outputting the driver output signal and the first bias current to the output device.

20 Claims, 2 Drawing Sheets

DATA DRIVERS

TECHNICAL FIELD

The present disclosure is related to apparatus and methods for data drivers, in particular for laser drivers for driving lasers for optical communications.

BACKGROUND

Optical data transmission is used in many applications. For optical data transmission, optical radiation is modulated to encode the data to be transmitted, and the modulated optical radiation is typically transmitted via an optical link, such as via one or more fibre optical cablers, to a receiver.

The modulated optical radiation may be generated by driving an optical source, typically a laser, to provide a suitable modulated output signal. The modulation may be a modulation in amplitude of the output optical signal, i.e. a variation in intensity, where the amplitude is varied to form a series of symbols encoding the data. In some cases the amplitude modulation could be a binary modulation, e.g. so that the symbols have a high or a low amplitude to encode a 1 and 0 respectively (or vice versa), but in some cases the amplitude could be modulated to more than two different defined levels, e.g. PAM4 modulation involves modulating each symbol to one of four different amplitude levels so as to encode two bits of data. A laser driver is thus arranged to receive the input data to be transmitted and the drive the laser to provide the required modulated optical output.

A laser driver may typically be implemented as an integrated circuit, but conventional laser drivers may typically make use of external, i.e. off-chip, components such as inductors and/or capacitors, which can add to the size and cost of the driver.

Other data transmission methods, e.g. as electrical signal over a suitable wireline link, may also make use of similar data drivers.

Embodiments of the present disclosure relate to methods and apparatus for data drivers, in particular for laser drivers.

BRIEF SUMMARY

According to some embodiments there is provided a driver circuit comprising: a driver configured to receive an input signal and generate a corresponding driver output signal for driving an output device; a bias generator comprising a first output branch connected to an output node of the bias generator, wherein a first control loop is configured to control a current in the first output branch to have a defined relationship to a bandgap referred current to provide a first bias current for biasing the output device; and a driver output node coupled to the driver and to the output node of the bias generator for outputting the driver output signal and the first bias current to the output device.

In some implementations the first output branch of the bias generator may comprise a first resistance and the first control loop may be configured to control the current in the first output branch so that a voltage across the first resistance is equal to a voltage across a second resistance, wherein the voltage across the second resistance is defined by the bandgap referred current flowing through the second resistance. The first resistance and second resistance may be configured to have a matching unit resistance.

In some implementations, the output branch may comprise a first transistor in series between a supply voltage and the first resistance, and the first control loop may comprise a first op-amp for driving the first transistor. A second transistor may be coupled in series with the second resistance between the supply voltage and a bandgap referred current source for generating the bandgap referred current. The first control loop may also comprise a second op-amp for driving the second transistor, wherein first and second inputs of the first op-amp are coupled to a high-side of the first and second resistances respectively and first and second inputs of the second op-amp are coupled to a low-side of the first and second resistances respectively.

The first control loop may have a bandwidth such that at a frequency of modulation of the driver output signal the first output branch operates as a termination impedance for the driver output signal. In some example, the first output branch may comprise a third resistance in series between the first resistance and the output node of the bias generator and the series resistance of the first and third resistances may be matched to a termination impedance for the for the driver output signal.

In some implementations the output node of the bias generator may be coupled to the driver output terminal by an inductor. The inductor may be an integrated inductor which is formed as part of an integrated circuit with the bias generator and driver.

In some implementations, the bias generator may further comprises a current generator with a second output branch connected to an output node of the bias generator, wherein the current generator is configured to generate a driver bias current in the second output branch for biasing the output current. In some implementations, the driver may comprise a first driver circuit branch having an input transistor driven by the input signal so that a current in the first driver circuit branch is equal to a defined tail current modified by the driver output signal and the current generator of the bias generator may be configured to generate the driver bias current to be equal to the defined tail current. The current generator may be configured to receive a control current related to the defined tail current. In some implementations, the current generator may comprise a first current generator resistance in the second output branch and the current generator may be configured to control the current in the second output path so that a voltage across the first current generator resistance matches a voltage across a second current generator resistance, where the voltage across the second current generator resistance is defined by the control current and a ratio of the first and second generator resistances matches a ratio between the control current and the defined tail current.

In some examples, the driver may be a differential-to-single-ended shunt driver.

In some implementations, the driver may be a laser driver for driving a laser as the output device. In which case, the first control loop may be configured to track changes to a laser forward voltage such that the first bias current is independent of the laser forward voltage. An aspect also relates to an apparatus comprising the driver circuit and a laser coupled to be driver by the driver circuit. The laser may comprise comprises a vertical-cavity-surface-emitting-laser diode.

In a further aspect, there is provided a driver circuit comprising: a driver configured to receive an input signal and generate a corresponding driver output signal for driving an output device; a bias generator comprising a first control loop configured to control a current in a first output branch to provide a first temperature stable bias current for biasing the output device, and a driver output node coupled to the driver and to the output node of the bias generator for outputting the driver output signal and the first bias current to the output device; wherein the first control loop has a bandwidth such that first output branch acts as a termination impedance for the driver output signal at a modulation frequency of the driver output signal.

The first output branch of the bias generator may be coupled to the driver output terminal by integrated inductor which is formed as part of an integrated circuit with the bias generator and driver.

The description herein describes various features and example implementations of embodiments of the invention. In general, unless such features are clearly incompatible, it will be understood that any feature may be implemented in combination with any one or more of the other features.

BRIEF DESCRIPTION OF THE DRAWINGS

To better explain various embodiments and examples of the present disclosure and the principles, example implementation and operation thereof, reference will now be made, by way of example, to the following drawings, in which.

DETAILED DESCRIPTION

Embodiments of the present disclosure relate to data drivers, in particular to data drivers such as may be used for driving a laser, i.e. laser drivers, for optical communications, i.e. as part of an optical transmitter or transceiver.

Figure 1:
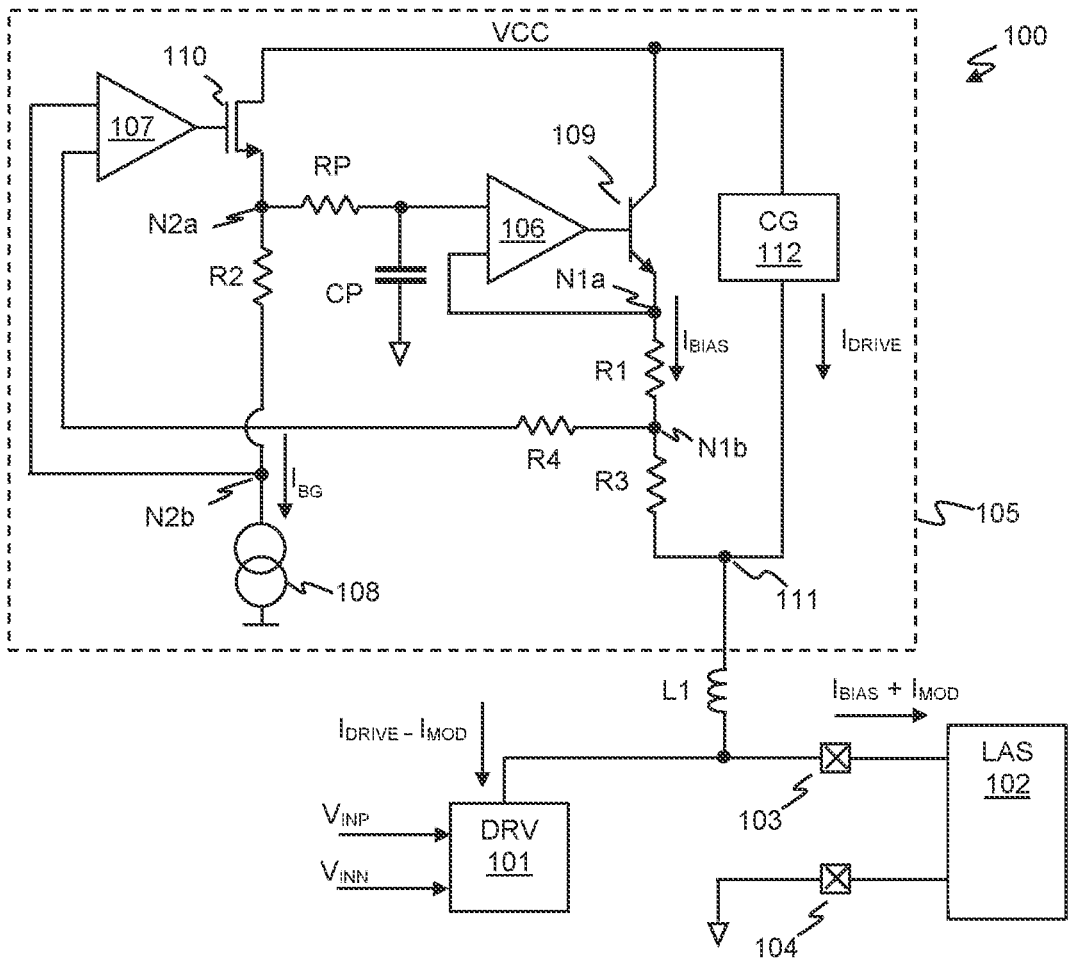
FIG. 1 illustrates one example of a laser driver according to an embodiment.

FIG. 1 illustrates one example of data driver apparatus according to an embodiment, which in this example is a laser driver apparatus 100. The laser driver apparatus 100 comprises a driver 101 for receiving an input data signal and generating a corresponding output drive signal for driving a laser 102 via a driver output terminal 103. The laser 102 may, for example, comprise a VCSEL (vertical cavity surface emitting laser) diode. In at least some applications, the laser driver apparatus may be implemented as an integrated circuit but the laser 102 may be an external, i.e. off-chip, component connected between the driver output terminal 103 and a ground terminal 104. In this example, the driver 101 is a differential-to-single-ended shunt driver, which receives differential inputs $V_{INP}$ and $V_{INN}$ and generates a corresponding current signal $I_{MOD}$ for driving the laser 102, as will be understood by one skilled in the art.

The laser driver apparatus also comprises a bias generator 105 for biasing the laser 102 and the driver 101. The bias generator 105 comprises a nested control loop for generating a bandgap referred bias current $I_{BIAS}$ for biasing the laser 102.

The bias generator 105 comprises a first output circuit branch for outputting the bias current $I_{BIAS}$. The first output branch comprises a first resistance R1. The control loop comprises a first op-amp 106 and a second op-amp 107 which are configured in a nested arrangement to control a current through the first resistance R1 so that the voltage across the first resistance R1 is equal to a voltage across a second resistance R2, which is defined by a bandgap referred current $I_{BG}$. The bandgap referred current $I_{BG}$ is generated by a bandgap referred current source 108 which is in series with the second resistance R2 in what will be referred to herein as a reference circuit branch.

The current $I_{BIAS}$ through the first resistance R1 is thus regulated to be equal to the product of $I_{BG}$ and the ratio of the resistances R1 and R2. If, for instance, R2=K*R1, where K is a constant, then the bias current will be given by $I_{BIAS}$=K*$I_{BG}$.

In the example of FIG. 1, the first op-amp 106 is configured to drive a first transistor 109, which is in series with the first resistance in the first output circuit branch, and the second op-amp 107 is configured to drive a second transistor 110, which is in series with the second resistance R2 in the reference circuit branch (on the opposite side of R2 to the current source 108).

A first input of the first op-amp 106 (which may be the inverting input) is connected to a node N1$a$ of the first output circuit branch, which in this example is located between the first transistor 109 and the first resistance R1. A second input of the first op-amp 106 (which may be the non-inverting input) is connected to a node N2$a$ of the reference current branch (in this case between the second transistor 110 and the second resistance R2).

A first input of the second op-amp 107 (which may be the non-inverting input) is connected to a node N1$b$ of the first output circuit branch, which in this example is located on the other side of the first resistance R1 to node N1$a$. A second input of the second op-amp 107 (which may be the inverting input) is connected to a node N2$b$ of the reference current branch (in this case between the second transistor 110 and the second resistance R2).

In essence the second op-amp 107 forms part of one control loop that drives the second transistor 110 to control the voltage at node N2$b$ to match that at node N1$b$, whilst the first op-amp forms another control loop that controls the current $I_{BIAS}$ through the resistance R1 so that the voltage at node N1$a$ matches that at node N2$a$. In this way the voltage across R1 due to the current $I_{BIAS}$ is regulated to match the voltage across R2 due to the bandgap current $I_{BG}$.

In the example of FIG. 1, the first output circuit branch also includes a resistance R3 in series between the first resistance R1 and the output node 111 and node N1$b$ is located between the resistances R1 and R3. Resistance R3 may be selected, as will be described in more detail below, to provide, together with resistance R1, an overall desired resistance for the first output circuit branch for termination of signals from the driver 101 at the output node 111. The second op-amp 107 may be connected to this node N1$b$ by a resistance R4, with the resistance being sized to effectively mask the input capacitance of the op-amp 107. In the example of FIG. 1, the first op-amp 106 is connected to the node N2$a$ via a path that includes resistance RP and to which capacitance CP is connected, and the values RP and CP may set at least one parameter of the overall loop response as would be understood by one skilled in the art.

This control loop arrangement, as noted above, generates the bias current $I_{BIAS}$ in the first output branch with a defined relationship to the bandgap referred current $I_{BG}$.

As will be understood by one skilled in the art, the bandgap referred current $I_{BG}$ is a stable current that does not vary with temperature or power supply voltage and therefore the bias current $I_{BIAS}$ is also stable and does not substantially vary with temperature or power supply variations. The bandgap referred current source 108 may be implemented to provide the bandgap referred current in a variety of ways, as will be understood by one skilled in the art, for instance a bandgap voltage may be applied across a defined resistance, which may be an integrated resistor such as a tantalum resistor, which has a resistance value which does not substantially change with temperature. In some cases the absolute value of the bandgap current $I_{BG}$ could be calibrated after manufacture, by appropriate testing and trimming, to minimise the effect of any manufacturing process variations. The resistances R1 and R2 may also be designed and laid out as part of the circuit so as to have a matching unit resistance, i.e. a unit resistance such that any process or temperature variations will be expected affect both resistances in the same way, so that the bias current $I_{BIAS}$, which has a dependence on the ratio of these two resistances, will be immune to any process or temperature variations for these resistances.

The bias generator 105 is thus operable to generate a bias current $I_{BIAS}$ with a defined value and which is stable against variation in supply voltage or temperature and which may also be substantially immune to manufacturing process variations.

This bias current $I_{BIAS}$ is supplied to the output node 111 of the bias generator 105, which is connected to the driver output terminal 103 and the same current is sourced into the laser 102. The control loop tracks any low-speed voltage variations of the driver output terminal 103 and thus the bias current $I_{BIAS}$ is immune to the forward bias voltage of the laser 102, i.e. the bias current $I_{BIAS}$ is constant and independent of the laser forward voltage.

The bias generator of the example of FIG. 1 also includes a current generator 112 for generating a current $I_{DRIVE}$ for the driver. As will be understood by one skilled in the art, the driver 101 operates to provide a current modulation based on the differential input signal so that a current $I_{DRIVE}-I_{MOD}$ flows through the driver and the driver output is a current signal $I_{MOD}$ which is supplied to the laser 102 together with the bias current $I_{BIAS}$. The current generator 112 is configured to supply the driver bias current $I_{DRIVE}$ to the output node 111 via a second, i.e. a separate, output branch of the bias generator. The reduces the maximum current in each of the separate current generation branches, i.e. the first and second output circuit branches, compared to using a single branch which generates both currents. This can result in an increased headroom for the transistors in the respective branches which can provide better linearity at higher modulation currents. The current generator 112 presents a high impedance such that the resistances R1 and R3 of the first output circuit branch for generating $I_{BIAS}$ define the effective AC termination resistance. The driver bias current $I_{DRIVE}$ may be generated by a control loop which is parallel to the nested loop for generating the bias current $I_{BIAS}$ for the laser as will be discussed in more detail below.

The bias generator 105 thus employs negative feedback to provide a stable bias current, that is substantially immune to variations of supply voltage, temperature and/or manufacturing process variations, i.e. PVT variations, whilst delivering a suitable driver signal, e.g. a drive signal for PAM4 modulation, to the laser. The bias current may also be substantially immune to any variation in laser forward voltage.

The output node 111 of the bias generator is, in the example of FIG. 1, coupled to the output node via an inductance L1. The inductance L1 may be implemented by an integrated inductor, i.e. by an inductor formed as an integrated component as part of an integrated circuit with the bias generator 105 and driver 101. This avoids the parasitic capacitance of the bias generator 105 being directly connected to the driver output terminal 103 which could detrimentally impact the bandwidth of the driver apparatus. The inductance L1 effectively masks at least some of the parasitics of the bias generator from the output terminal 103 and thus reduces parasitic loading of the output terminal 103 that could limit bandwidth.

The nested control loop of the bias generator 105 may be configured to have a limited bandwidth, for instance a bandwidth lower than about 100 kHz. This means that the circuit branch of the bias generator 105 that generates $I_{BIAS}$ at DC, will, for higher frequencies such as would be expected for the data modulation rate, effectively appear as a fixed resistance. Thus the bias generator 105 may be configured to act as an AC termination resistance for the driver 101.

The first op-amp 106 provides the DC voltage bias for the first transistor 109 and the effective series impedance of the first transistor 109 is relatively low, so the series resistances R1 and R3 dominate. The effective AC termination resistance $R_T$ is thus given be $R_T \approx R1+R3$. These resistance values can thus be selected to provide a suitable termination impedance. This allows the bias generator 105 to also provide a suitable termination resistance for the driver 101 without the need for any external, i.e. off chip components, and without losing any DC power.

Figure 2:
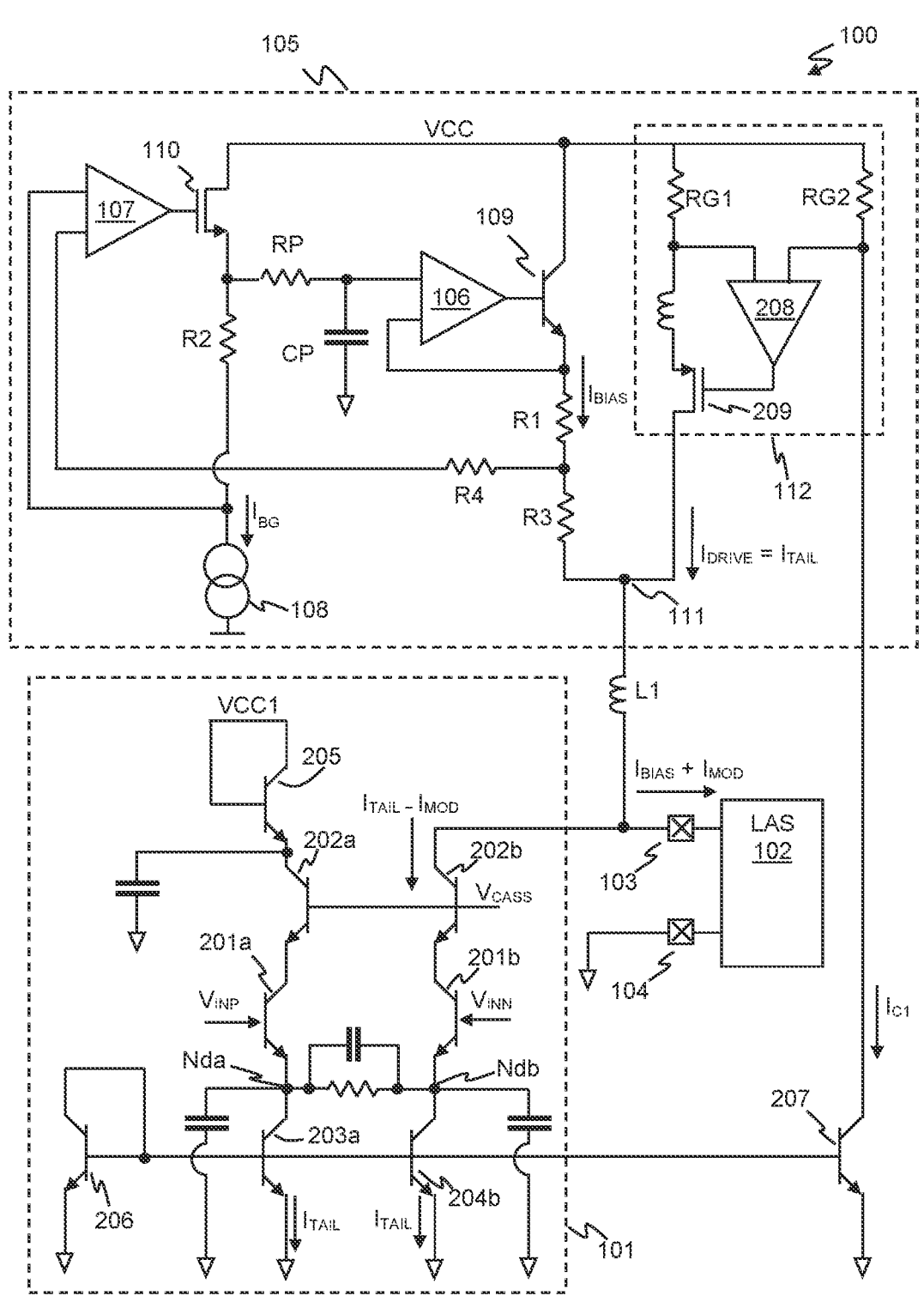
FIG. 2 illustrates another example of a laser driver in more detail.

FIG. 2 illustrates another example of a laser driver apparatus 100 which illustrates examples of the driver 101 and current source 112 in more detail. In FIG. 2, similar components as those discussed with respect to FIG. 1 are identified by the same reference numerals.

FIG. 2 illustrates that the driver 101 comprises first and second input transistors 201a and 201b in respective first and second driver circuit branches, each branch also comprising, in this example, a respective cascode transistor 202a and 202b. The input transistors 201a and 201b are driven by the differential input signal. Transistors 203a and 203b are coupled to first and second nodes Nda and Ndb of the first and second driver circuit branches to each pass a defined tail current $I_{TAIL}$. The first and second nodes Nda and Ndb of the first and second driver circuit branches are connected to one another via a resistance and parallel capacitance and also connected to ground via respective capacitors. One of the first and second current branches, in this example the second current branch, is connected (in this example via inductor L1) to the output 111 of the bias generator 105 so as to provide a bias current for that driver circuit branch, whilst the other branch, in this example the first driver circuit branch receives a current from a supply voltage VCC1 via transistor 205. In use, the driver 101 shunts or steers current to/from the relevant current branches in response to the differential input signal and thus the current through the second driver circuit branch is equal to the defined tail current as modified by the driver output signal, i.e. equal to $I_{TAIL}-I_{MOD}$ where the driver output signal $I_{MOD}$ depends on the differential input signal.

The tail current $I_{TAIL}$ for each of the first and second branches is defined, in this example using current mirroring, by a controlled current through transistor 206. A control current $I_{C1}$ related to the tail current $I_{TAIL}$ is also supplied to the current generator 112 of the bias generator, in this example by current mirroring through transistor 207. The current generator 112 has a first current generator resistance RG1 in the second output circuit branch and an op-amp 208 controls transistor 209 so that the voltage across resistance RG1 is the same as a voltage across a second current generator resistance RG2, where the voltage across RG2 is defined by passing the control current $I_{C1}$ through resistance RG2. The ratio between the first and second current generator resistance RG1 and RG2 matches the ratio between the control current $I_{C1}$ and the tail current $I_{TAIL}$. The output of the current generator 112 is thus a bias current $I_{DRIVE}$ for the driver that it matched to, and varies with, the tail current $I_{TAIL}$ of the second current branch of the driver 101.

This driver bias current $I_{DRIVE}$ ($=I_{TAIL}$) generated in the first output circuit branch of the bias generator 105 is combined with the stable bias current $I_{BIAS}$ generated in the first output circuit branch and output from the bias generator output node 111. As discussed above the operation of the driver 101 means that the second driver circuit branch of the driver draws a current equal to $I_{TAIL}-I_{MOD}$ from the current output from the bias generator 105, which means that the current into the laser 102 is equal to $I_{BIAS}+I_{MOD}$.

Note that the examples of FIGS. 1 and 2 have been discussed with respect to laser drivers for driving a laser to provide a modulated optical output and the driver of embodiments of the present invention is very well suited as a laser driver. However the same principles may be applied for other data transmission schemes, for example wireline parallel to serial data transmission and embodiments of the present disclosure also relate to drivers for other types of data transmission.

The driver of embodiments of the present disclosure thus provides DC biasing of an output device, such as a laser. The driver can be implemented as an integrated circuit (IC) and provide the biasing from the power supply of the IC, i.e. the chip power supply, without the need for any external, i.e. off-chip components. The bias generator may also provide AC termination for the driver without the need for external components. The driver can use on-chip components, such as an inductor to reduce any parasitic loading of the driver output terminal so as to maintain a relatively high bandwidth for the driver. The bias current for the output device is stable and trimmable which can be substantially immune to variations in power supply voltage or temperature or manufacturing process variations. Using parallel feedback loops to bias the output device and driver independently can also provide an increased headroom for transistors of the separate loops which can allow for better linearity.

Thus a high-performance data driver, in particular a laser driver, is provided that can be implemented without the need for any external or off-chip components. This can allow the data driver to be integrated into high density modules and/or reduces the cost of materials. The bias current may also be independent of the forward voltage.

It will be understood that the examples and embodiments described above are given by way of example only and those skilled in the art will understand that modifications, variations, additions or alterations may be made to specific embodiments described, or alternative embodiments may be implemented, without departing from the scope of the appended claims.

It should be noted that as used herein, unless expressly stated otherwise, the word "comprising" does not exclude the presence of other elements or steps other than those listed, references to an element or feature in the singular does not exclude the possibility of a plurality of such elements or features, and that recitation of different features or elements in the appended claims does not necessarily imply separate components; a single component or unit may fulfil the function of several elements recited in a claim. Any reference signs in the appended claims shall not be construed so as to limit their scope.

The invention claimed is:

1. A driver circuit comprising:
   a driver configured to receive an input signal and generate a driver output signal that corresponds to the received input signal for driving an output device;

a bias generator comprising a first output branch connected to an output node of the bias generator, wherein a first control loop is configured to control a current in the first output branch to have a defined relationship to a bandgap referred current to provide a first bias current for biasing the output device; and
   a driver output node coupled to the driver and to the output node of the bias generator for outputting the driver output signal and the first bias current to the output device.

2. The driver circuit of claim 1 wherein the first output branch of the bias generator comprises a first resistance and wherein the first control loop is configured to control the current in the first output branch so that a voltage across the first resistance is equal to a voltage across a second resistance, wherein the voltage across the second resistance is defined by the bandgap referred current flowing through the second resistance.

3. The driver circuit of claim 2 wherein the first resistance and second resistance are configured to have a matching unit resistance.

4. The driver circuit of claim 2 wherein the first output branch comprises a first transistor in series between a supply voltage and the first resistance and the first control loop comprises a first op-amp for driving the first transistor.

5. The driver circuit of claim 4 wherein a second transistor is coupled in series with the second resistance between the supply voltage and a bandgap referred current source for generating the bandgap referred current and the first control loop comprises a second op-amp for driving the second transistor, wherein first and second inputs of the first op-amp are coupled to a high-side of the first and second resistances respectively and first and second inputs of the second op-amp are coupled to a low-side of the first and second resistances respectively.

6. The driver circuit of claim 1 wherein the first control loop has a bandwidth such that at a frequency of modulation of the driver output signal the first output branch operates as a termination impedance for the driver output signal.

7. The driver circuit of claim 1 wherein the first output branch comprises a third resistance in series between the first resistance and the output node of the bias generator and wherein the series resistance of the first and third resistances are matched to a termination impedance for the for the driver output signal.

8. The driver circuit of claim 1 wherein the output node of the bias generator is coupled to the driver output terminal by an inductor.

9. The driver circuit of claim 8 wherein said inductor is an integrated inductor which is formed as part of an integrated circuit with the bias generator and driver.

10. The driver circuit of claim 1 wherein the bias generator further comprises a current generator with a second output branch connected to the output node of the bias generator, wherein the current generator is configured to generate a driver bias current in the second output branch for biasing the output current.

11. The laser driver circuit of claim 10 wherein the driver comprise a first driver circuit branch having an input transistor driven by the input signal so that a current in the first driver circuit branch is equal to a defined tail current modified by the driver output signal and wherein the current generator of the bias generator is configured to generate the driver bias current to be equal to the defined tail current.

12. The laser driver circuit of claim 11 wherein the current generator is configured to receive a control current related to the defined tail current.

13. The driver circuit of claim 11 wherein the current generator comprises a first current generator resistance in the second output branch and the current generator is configured to control the current in the second output path so that a voltage across the first current generator resistance matches a voltage across a second current generator resistance, wherein the voltage across the second current generator resistance is defined by the control current and a ratio of the first and second generator resistances matches a ratio between the control current and the defined tail current.

14. The driver circuit of claim 1 wherein the driver is a differential-to-single-ended shunt driver.

15. The driver circuit of claim 1 wherein the driver is a laser driver for driving a laser as the output device.

16. The driver circuit of claim 15 wherein the first control loop is configured to track changes to a laser forward voltage such that the first bias current is independent of the laser forward voltage.

17. An apparatus comprising the driver circuit of claim 15 and a laser coupled to be driver by the driver circuit.

18. The apparatus of claim 17 wherein the laser comprises a vertical-cavity- surface-emitting-laser diode.

19. A driver circuit comprising:

a driver configured to receive an input signal and generate a driver output signal that corresponds to the received input signal for driving an output device;

a bias generator comprising a first control loop configured to control a current in a first output branch to provide a first temperature stable bias current for biasing the output device, and a driver output node coupled to the driver and to the output node of the bias generator for outputting the driver output signal and the first bias current to the output device;

wherein the first control loop has a bandwidth such that first output branch acts as a termination impedance for the driver output signal at a modulation frequency of the driver output signal.

20. The driver circuit of claim 19 wherein the first output branch of the bias generator is coupled to the driver output node by integrated inductor which is formed as part of an integrated circuit with the bias generator and driver.

* * * * *